US011323018B2

(12) United States Patent
Doering et al.

(10) Patent No.: US 11,323,018 B2
(45) Date of Patent: May 3, 2022

(54) METHOD FOR CONTROLLING CONTROLLABLE POWER SEMICONDUCTOR SWITCHES OF A CONVERTER ASSEMBLY WITH A PLURALITY OF SWITCHING MODULES HAVING CONTROLLABLE POWER SEMICONDUCTOR SWITCHES, AND A CONVERTER ASSEMBLY WITH A CONTROL SYSTEM CONFIGURED FOR PERFORMING THE METHOD

(71) Applicant: Siemens Energy Global GmbH & Co. KG, Munich (DE)

(72) Inventors: David Doering, Erlangen (DE); Gerald Franz Giering, Kalchreuth (DE); Klaus Wuerflinger, Nuremberg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 126 days.

(21) Appl. No.: 16/519,219

(22) Filed: Jul. 23, 2019

(65) Prior Publication Data

US 2021/0028684 A1 Jan. 28, 2021

(51) Int. Cl.
*H02M 1/08* (2006.01)
*H02M 1/084* (2006.01)
(Continued)

(52) U.S. Cl.
CPC .......... *H02M 1/0845* (2013.01); *G08C 23/06* (2013.01); *H01L 25/112* (2013.01); *H02M 5/45* (2013.01);
(Continued)

(58) Field of Classification Search
CPC ..... H02M 1/0845; H02M 5/45; H01L 25/112; G08C 23/06; H03K 17/0822; H03K 17/78
See application file for complete search history.

(56) References Cited

U.S. PATENT DOCUMENTS 4,816,980 A 3/1989 Wiendl
8,097,926 B2 * 1/2012 De Graff .................. A61B 8/12
257/419
(Continued)

FOREIGN PATENT DOCUMENTS

EP 299275 A1 6/1988
EP 1995863 A2 11/2008
WO 2016155850 A1 10/2016

*Primary Examiner* — Jeffrey A Gblende
(74) *Attorney, Agent, or Firm* — Laurence A. Greenberg; Werner H. Stemer; Ralph E. Locher

(57) ABSTRACT

A control system controls a plurality of controllable units with a central control device and further has a plurality of control modules, each of which is assigned to one of the units to be controlled. The central control device is set up to exchange digital data with each control module. The control modules form a connection network, wherein each control module is connected to at least one other control module via a communication line so that data exchange between them is possible. One of the control modules is directly connected to the central control device as the master node of the connection network, and the control modules are set up to form a communication network within the connection network, so that the data exchange between the central control device and each control module can be respectively carried out via an assigned communication path within the communication network.

10 Claims, 2 Drawing Sheets

(51) Int. Cl.
*H02M 5/45* (2006.01)
*G08C 23/06* (2006.01)
*H01L 25/11* (2006.01)
*H03K 17/082* (2006.01)
*H03K 17/78* (2006.01)
*H02M 7/483* (2007.01)
*H02M 1/00* (2006.01)

(52) U.S. Cl.
CPC ........ *H02M 7/483* (2013.01); *H03K 17/0822* (2013.01); *H03K 17/78* (2013.01); *H02M 1/0003* (2021.05); *H02M 7/4835* (2021.05)

(56) References Cited

U.S. PATENT DOCUMENTS

| | | | |
|---|---|---|---|
| 9,432,298 B1* | 8/2016 | Smith | H04L 49/9057 |
| 2002/0116092 A1* | 8/2002 | Hamamatsu | H02H 3/05 |
| | | | 700/295 |
| 2008/0284252 A1 | 11/2008 | Jones et al. | |
| 2011/0267854 A1* | 11/2011 | Flannery | H02M 7/493 |
| | | | 363/72 |
| 2013/0223115 A1* | 8/2013 | Tsuchiya | H02M 1/0845 |
| | | | 363/68 |
| 2014/0169053 A1 | 6/2014 | Ilic et al. | |
| 2014/0338552 A1* | 11/2014 | Mace | F42B 3/182 |
| | | | 102/215 |
| 2015/0023080 A1* | 1/2015 | Chambon | H02M 7/537 |
| | | | 363/131 |
| 2015/0107824 A1* | 4/2015 | Signorelli | E21B 41/0085 |
| | | | 166/244.1 |
| 2015/0326215 A1* | 11/2015 | Snook | H02J 13/00016 |
| | | | 327/427 |
| 2018/0076735 A1 | 3/2018 | Bakran et al. | |
| 2019/0206565 A1* | 7/2019 | Shelton, IV | A61B 34/74 |

* cited by examiner

METHOD FOR CONTROLLING CONTROLLABLE POWER SEMICONDUCTOR SWITCHES OF A CONVERTER ASSEMBLY WITH A PLURALITY OF SWITCHING MODULES HAVING CONTROLLABLE POWER SEMICONDUCTOR SWITCHES, AND A CONVERTER ASSEMBLY WITH A CONTROL SYSTEM CONFIGURED FOR PERFORMING THE METHOD

The invention relates to a control system for controlling a multitude of controllable units having a central control device and a multitude of control modules, each of which is assigned to one of the units to be controlled, wherein the central control device is set up to exchange digital data with each control module.

Such a control system is known from converter technology. If a converter system comprises controllable electronic switches, these are usually controlled, conducted and blocked, by means of the control modules while operating the converter system. In this way, so-called converter valves can be implemented. Thereby, the central control device has a regulating and coordinating function. In the known control system, the central control device is connected to each of the control modules via its own communication lines designated for this. However, this has the disadvantage that a multitude of communication lines must be laid within the converter system and guided to the central control device. Each of the communication lines must have a defined and determined length. This reduces the flexibility of the known control system's construction. In addition, a common cause of faults in the converter system is a communication failure between the central control device and one of the control modules. To avoid such faults from occurring, each of the communication lines would have to be redundant, for example, be duplicated. However, this would further increase the work effort and costs.

The object of the invention is to propose a control system of the above type, which is relatively cost-effective and, at the same time, reliable.

The object is achieved in the case of an appropriate control system according to the invention in that the control modules form a connection network, wherein each control module is connected to at least one other control module via a communication line, so that data exchange between them is possible, one of the control modules is directly connected to the central control device as the master node of the connection network, and the control modules are set up to form a communication network, preferably a hierarchical communication network with a tree structure within the connection network, so that the data exchange between the central control device and each control module can be carried out via a communication path assigned to this control module within the communication network. Accordingly, the control system according to the invention comprises control modules, which are connected to each other to form a connection network. The control modules expediently comprise interfaces that allow for the communication lines to be connected. The control module, which is defined as a master node, is directly connected to the central control device. All other control modules are connected to the central control device via the master node. The control modules are expediently set up to forward received data. In this way, the control modules can assume a routing function for downstream control modules during communication or data exchange. In the context of the invention, more than one master node can also be defined, wherein each of the master-node control modules is directly connected to the central control device.

The arrangement of the control modules in the connection network generally means that there are a plurality of possible paths within the connection network between the master node and each control module. In order to define a unique communication path for each control module, the control modules appropriately form a hierarchical communication network with a tree structure in the sense of a communication tree. In this context, a tree is understood to be a network or graph structure that does not contain closed communication loops. Therefore, only a few, however, not all, communication lines are used within the connection network. For example, the master node communicates with a plurality of control modules, which it adjoins within the connection network, meaning it is connected in each case directly by means of a communication line, wherein, however, these control modules do not communicate with each other. Each of the control modules expediently automatically defines one among all adjoining control modules as being the parent control module, from which it then receives data during the operation of the control system. This determination appropriately takes place based on certain criteria, such as the physical distance between the control module and the master node for example. During further operation of the control system, the other communication lines are not initially used. Alternatively, these other communication lines can also be used, but the information or data transmitted across them is however ignored or not used by the receiving control modules.

An advantage of the control system according to the invention is the reduced total length of the required communication lines compared to the known control system. Typically, the distance of the control modules to each other is much shorter than the distance between one of the control modules and the central control device. The structure of the connection network requires an increase in the number of individual communication lines under certain circumstances. However, these can be designed to be much shorter.

Another advantage of the control system according to the invention can be seen in that there are always a plurality of possibilities to design the communication network within the connection network. In the event of a failure of one of the control modules, the faulty control module or a faulty communication line can be bypassed by reforming the communication network without the functionality of the entire control system being adversely affected.

Preferably, each control module is set up to evaluate a transmission time of data that this control module receives from different adjoining control modules within the connection network, so that a shortest communication path for each control module can be detected. Thus, the control module selects, as the parent control module, the one from which it receives transmitted data the fastest. For example, if a control module is connected to three other control modules by means of the communication lines, the control module initially receives control data from the central control device from all three adjoining control modules and evaluates them. Thereby, the control module is expediently set up to recognize which adjoining control module the received data was received from first. The corresponding adjoining control module can be defined as the parent control module. In this way, the shortest communication path can be determined for each control module. The selection is appropriately communicated to the respectively selected parent control module. This procedure is omitted for the master node because it is directly connected to the central control device. This approach has the advantage that it enables a particularly fast data exchange.

To increase redundancy, it is conceivable to define more than one master node. The data connection or communication line between the master node and the central control device can also be redundant, meaning with a plurality of parallel lines.

In accordance with one embodiment of the invention, some, particularly preferably all, communication lines, are fiber optic cables. Fiber optic cables have the advantage that they are particularly suitable for environments where high electrical potentials occur. Accordingly, the data exchange can be carried out by means of light signals.

It is considered particularly suitable if the control modules are designed for digitally processing the data. This means that the control modules can not only receive and forward the data, but also process it. This means, for example, that the control module is for example set up to perform one or a plurality of operations: to select a maximum and/or minimum, a summation, a product formation, execution of an OR function, an AND function, a NOT function, a formation of intersections, a formation of set unions or the like. In this way, a part of the data processing of the control can favorably be carried out in the control modules themselves.

In accordance with one embodiment of the invention, each control module is connected to three other control modules. Thus, in the connection network, each control module comprises at least three, preferably exactly three adjoining control modules. In general, a stronger networking of the control modules means a higher level of networking effort, however, it ensures higher reliability. The number of exactly three adjoining control modules for each control module offers a particularly good compromise between the above-mentioned advantages and disadvantages.

Preferably, the control modules are set up for a two-way data exchange. This also allows the control modules to transmit certain data to the central control device. For example, the control modules can collect information about the state of the units to be controlled and send it to the central control device. This allows the control modules to assume part of a control feedback.

The invention further relates to a converter assembly with a multitude of switching modules with controllable power semiconductor switches.

Such a converter assembly is known, for example, from WO 2016/155850 A1. The converter of the known converter assembly is a so-called modular multistage converter (MMC). The MMC comprises converter valves, each of which extends between an AC-voltage connection and one of two DC poles of the MMC. The converter valves of the MMC each have a series circuit consisting of two-pole switching modules, wherein each switching module comprises power semiconductor switches that can be switched on and off, as well as an energy store, preferably in the form of a switching module capacitor. Each of the switching modules can be controlled individually by means of a control system. A falling voltage at the converter valve is identical to the sum of voltages that fall at the associated switching modules. By means of the MMC, a particularly advantageous cascaded converter voltage can be produced. The switching modules are usually designed as half-bridge circuits or as full-bridge circuits. The switching module in half-bridge circuit has two power semiconductor switches that can be switched off and the energy store, wherein the power semiconductor switches are interconnected with the energy store in such a way that a falling energy-store voltage at the energy store or a zero voltage can be produced at the output terminals of the switching module. Converter assemblies of this type are usually used for current conversion, for example, in high-voltage DC transmission, as well as for power factor correction or stabilization of AC grids. In such cases, the converter arm is arranged, for example, between two AC-voltage connections of the converter.

Another example of a corresponding converter assembly is known from EP 0 299 275 B1. There, a converter is described, the converter valves of which comprise thyristors that are arranged in housings in the form of modules. The modules are grouped into valve towers, which are mounted in a valve hall.

In general, in known converter assemblies, a control module is in each case assigned to each of the power semiconductor switches, which receives control signals for controlling the power semiconductor switches from a central control device of the converter assembly. The controllable power semiconductor switches are controlled in accordance with the control signals by means of the control modules to activate (conduct) the power semiconductor switches at predetermined points in time or, if possible, to block them.

The object of the invention is to propose such a converter assembly, which is as cost-effective and reliable as possible.

In the case of an appropriate converter assembly, the object is achieved according to the invention by means of the control system according to the invention, wherein a control module is assigned to each of the switching modules and the control system is set up to control the power semiconductor switches of the switching modules.

In particular, the advantages of the converter assembly according to the invention emerge from the previously described advantages of the control system according to the invention.

It is viewed as being particularly favorable if, in the case of the converter assembly, at least a liquid-tight encapsulation housing is provided, in which at least some of the power semiconductor switches are arranged thereby forming a modular converter unit, and the encapsulation housing is at least partially filled with an electrically insulating insulation liquid for the electrical insulation of the power semiconductor switches arranged therein, wherein the master node of the connection network is arranged outside of the encapsulation housing and the remaining control modules are arranged inside of the encapsulation housing. The control system of the converter assembly according to the invention favorably allows for a modular embodiment of the converter assembly. Therefore, there is no need to lay point-to-point connections between the central control device and the individual control modules. Instead, only one or, in the case of a redundant design, two or more communication lines is/are provided between the central control device and the master node. Thereby, the master node is arranged outside the encapsulation housing. All other communication lines are located inside the encapsulation housing. The communication lines from the master node to its adjoining control modules are partially located within the encapsulation housing and all other communication lines are completely located within the encapsulation housing. However, it is also conceivable to arrange the control modules adjoining the master node outside the encapsulation housing. In contrast to valve halls, which are known from the prior art, the converter units can be transported. Thus, the startup of the converter assembly can be favorably simplified. It is conceivable, for example, that each converter valve with the assigned encapsulation housing forms a modular converter unit. The modular converter units can be connected to each other, thereby forming the converter. Due to the liquid insulation, the encapsulation housing favorably has much smaller dimensions than the known valve hall. For example, the insulation clearances can be reduced to about one third and, in particularly favorable cases, even by a factor of ten. The simple construction and smaller dimensions favorably allow for a cost advantage over the previously known solutions. In particular, all power semiconductor switches may be housed in one or a plurality of encapsulation housings. The encapsulation housing(s) may be completely filled with the insulating liquid, which contains, for example, an ester. The power semiconductor switches of the converter assembly are preferably power semiconductor switches that can be switched on and off, such as IGBTs, IGCTs, or thyristors.

In accordance with an embodiment of the invention, the converter valves form a modular multistage converter. For this purpose, each of the converter valves comprises a series circuit consisting of two-pole switching modules, wherein each switching module comprises at least two power semiconductor switches, as well as an energy store, wherein at least some of the switching modules are arranged in the at least one encapsulation housing. In this way, a two-stage modular design of the converter is provided where the converter valves are modularly constructed with the switching modules (first stage of modularization), and the converter also comprises the modular converter units (second stage of modularization). The converter can, for example, be a modular multistage converter described at the beginning of the present document. Thereby, the converter valves can comprise switching modules with half-bridge circuits and/or with full-bridge circuits, wherein other switching module topologies are also conceivable.

Preferably, the converter assembly comprises a plurality of modular converter units, wherein at least some of the modular converter units can be connected to each other by means of gas-insulated or liquid-insulated electrical lines, thereby forming the converter of the converter assembly, for example, a modular multistage converter. By using the gas-insulated or liquid-insulated electrical lines for the connection of the individual converter units, the use of high-voltage connectors can be favorably done without. This reduces the costs of the converter assembly. The insulating medium of the lines is preferably identical to the insulating medium in the encapsulation housing.

Expediently, the converter assembly furthermore comprises at least one other high-voltage component, wherein the modular converter unit can be electrically connected to the high-voltage component by means of at least one gas-insulated or liquid-insulated electrical line. Thus, other components of the converter assembly, such as transformers or switchgear, are connected to the converter by means of similar lines, such as the modular converter units among one another. This can further simplify the construction of the converter assembly.

Furthermore, the invention relates to a method for controlling controllable power semiconductor switches of a converter assembly with a multitude of switching modules with controllable power semiconductor switches.

The object of the invention is to provide such a method that allows for the most reliable operation of the converter assembly.

According to the invention, the object is achieved by means of an appropriate method, in which a control system according to the invention is provided, which is set up for controlling the power semiconductor switches of the switching modules, a control module is assigned to each of the switching modules and the control of the power semiconductor switches is carried out by means of the control system, wherein the control modules form a communication network, preferably a hierarchical communication network with a tree structure, within the connection network, and the data exchange between the central control device and each control module takes place via a communication path assigned to this control module in the communication network, wherein the communication path is clearly defined for each control module in an appropriate manner.

The advantages of the method according to the invention emerge, in particular, from the already described advantages of the converter assembly according to the invention and the control system according to the invention.

In order to form the communication network, each control module expediently evaluates the data it receives from the adjoining control modules. The communication path is preferably defined for each of the control modules by determining a shortest transmission time for this control module. Thus, the control module, as the parent control module, preferably selects the one from which it receives transmitted data the fastest. This means, for example, that the control module can detect a time delay that is between a transmission time and a receiving time. A preferred way to determine the shortest communication path is if the data transmission is clocked, with a clock delay of less than 10 microseconds. For example, the central control device or the master node can send or forward the data to be transmitted with a defined time delay, wherein the data is provided with a counter value, which increases, for example, by one with every clock pulse. In this way, each control module can compare the received data and decide, based on the counter value, which adjoining control module is to be selected as the parent control module in order to obtain the shortest communication path, namely, the one from which the data was received with the lowest counter reading. In the case where a control module receives data from two or more adjoining control modules that have the same time delay (for example, having the same clock counter reading), additional integrated logic can ensure that one of these control modules is selected as the parent control module. This can be achieved, for example, by a random function or a suitable presetting. In addition, a switching threshold can be defined so that a changing back and forth of the selection of the parent control module between a plurality of different adjoining control modules is avoided.

Preferably, in the event of failure of one of the control modules or one of the communication lines, the hierarchical communication network is reformed. For example, if one of the communication lines fails, this is detected by the control system. After such an outage has been detected, the communication network is determined or formed again, wherein either only the control modules affected, i.e. the ones adjoining the failed communication line, or all control modules select and determine the parent control module assigned to them again. In this way, a new tree structure is created, so that the faulty communication line is bypassed without adversely affecting the control function of the control system. A similar procedure can also be carried out if one of the control modules fails.

It is also conceivable that data for a control of the converter assembly are transmitted between the control modules and the central control device. The control system thus assumes part of the control function.

The invention shall be further explained in the following on the basis of FIGS. 1 to 4.

Figure 1:
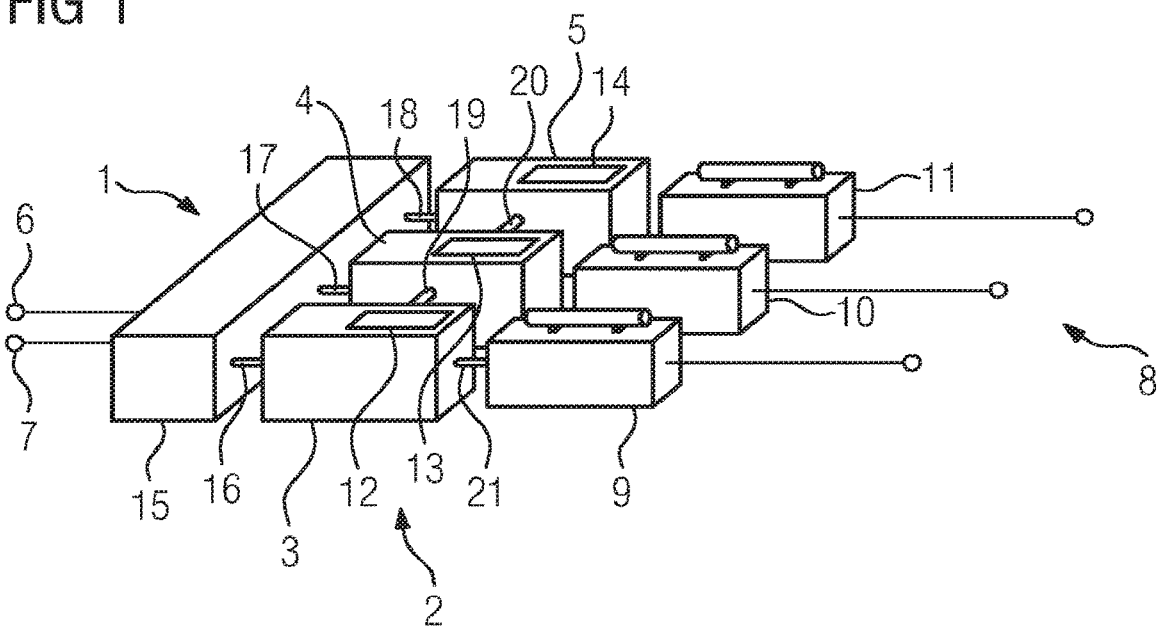
FIG. 1 shows an exemplary embodiment of a converter assembly according to the invention in a schematic overview representation.

In FIG. 1, a converter assembly 1 is shown. The converter assembly 1 comprises a converter 2. The converter 2 comprises three modular converter units 3, 4 and 5. The modular converter units 3-5 are constructed in the same way in this example. Each converter unit 3-5 comprises two converter valves of the converter, each extending between a first or a second DC pole 6 or 7 of the converter 2 and an AC-voltage connection of the converter for connecting the converter to the AC-voltage-side components of the converter assembly. In the exemplary embodiment shown in FIG. 1, the converter units 3-5 are connected to transformers 9-11 on the AC-voltage side.

Each modular converter unit 3-5 comprises a liquid-tight encapsulation housing. Each encapsulation housing is filled with an ester liquid. On the one hand, the ester liquid is used to electrically insulate the power electronic components of the converter valves, which is arranged within the encapsulation housing. On the other hand, the ester liquid is used for heat transport and thus for cooling the power semiconductor switches of the converter 2. Each encapsulation housing furthermore comprises a radiator 12, 13, 14 that improves heat transport toward the outside.

Electrical connections between the converter units 3-5 to each other as well as to the DC-side components 15 (e.g. chokes or switchgear) and to the AC-voltage-side components 9-11 (in the illustrated example, transformers), are implemented by means of liquid-insulated electrical lines 16-21. For the sake of clarity, only a few, however, not all electrical connections of the converter assembly 1 are graphically represented in FIG. 1. The transformers 9-11 each comprise a transformer housing that is liquid-tight. The electrical insulation inside the transformer housing can be provided by an insulating liquid such as an insulating oil or an ester liquid.

The converter assembly 1 has a connection 8 for connecting the converter assembly 1 to a three-phase AC grid.

Figure 2:
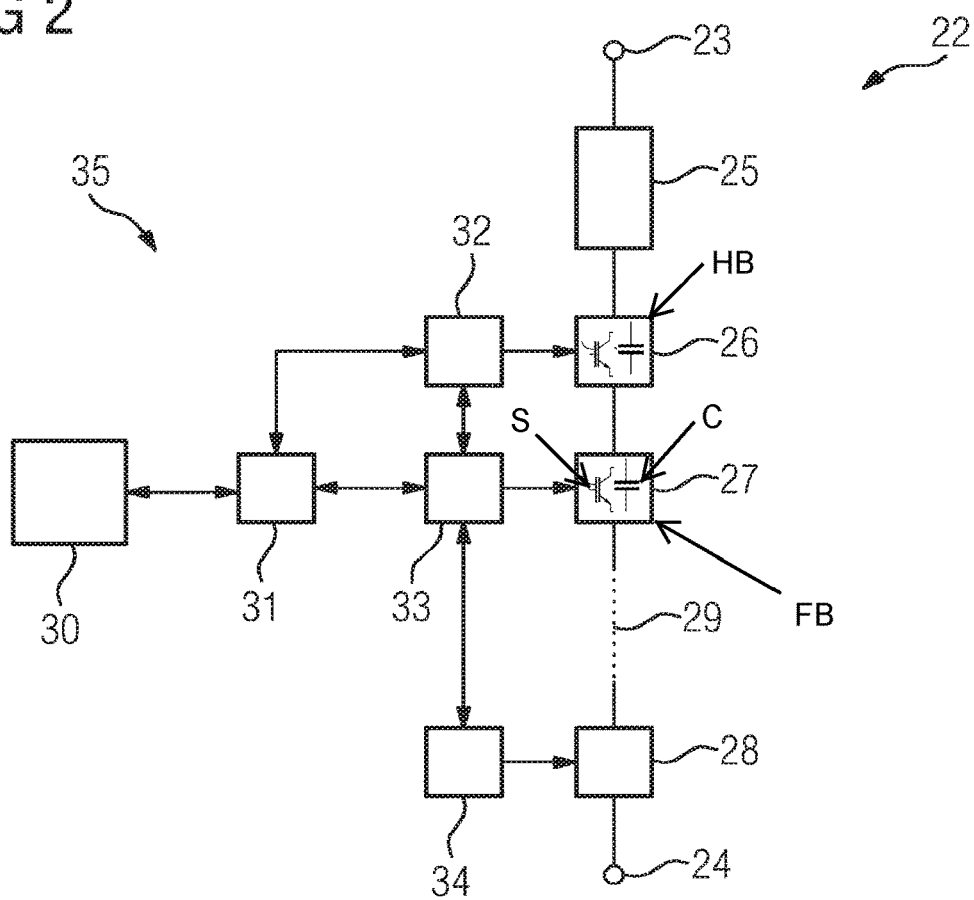
FIG. 2 shows an exemplary embodiment of a converter valve for the converter assembly in FIG. 1 in a schematic representation.

In FIG. 2, a converter valve 22 is shown that in the converter 2 or in one of the converter units 3-5 of the converter assembly 1 of FIG. 1 can be used. The converter valve 22 comprises a DC connection or DC pole 23 and an AC-voltage connection 24. In addition, the converter valve 22 throttle, as well as a plurality of switching modules 26, 27, 28. The number of switching modules is not limited to the one shown graphically in FIG. 2, which is indicated by a dotted line 29. The switching modules 26-28 are realized in the illustrated exemplary embodiment as half-bridge circuits HB or full-bridge circuits FB known to the person skilled in the art. Each switching module 26-28 thus comprises controllable power semiconductor switches S, as well as an energy store C in the form of a capacitor.

In FIG. 2, a control system 35 for controlling the power semiconductor switches of the switching modules 26-28 is also recognizable. The control system 35 comprises a central control device 30, which can communicate with a variety of control modules 31-34. One of the control modules assumes the function of a master node 31, which is directly connected to the central control device 30. Each of the switching modules 26-28 is assigned a control module 32-34, that can transmit switching commands from the central control device 30 to the power semiconductor switches of the switching modules 26-28. The switching modules 31-34 are connected to each other by means of communication lines, which are represented in FIG. 2 by double-headed arrows.

Figure 3:
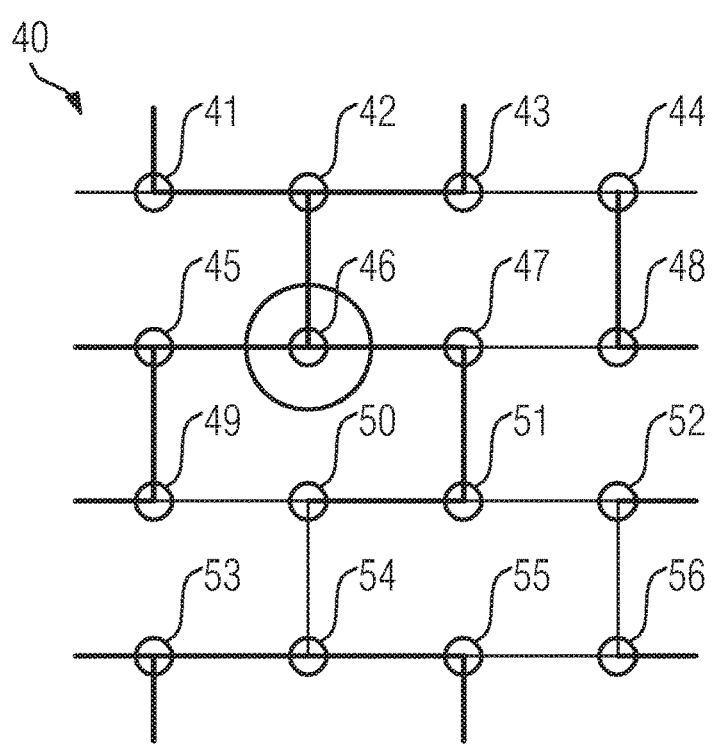
FIG. 3 shows an exemplary embodiment of a control system according to the invention in a schematic representation.

In FIG. 3, a section of a control system 40 is shown. The control system 40 comprises a variety of control modules 41-56. Each control module 41-56 is connected to three adjoining control modules by means of communication lines. For example, a first control module 41 is connected to a second control module 42, a fourth control module 44 and to a thirteenth control module 53. A sixth control module 46 is defined as a master node. It is connected to a central control device by means of another communication line (graphically not shown in FIG. 3). Furthermore, the sixth control module 46 is connected to a second control module 42, a fifth control module 45 and a seventh control module 47. The control modules 41-56 together with the communication lines between them thus form a connection network of the control system.

The control modules 41-56 of the connection network form a communication network in the following manner. The master node 46 receives the data directly from the central control device and thus forms a zero level of the communication network. The control modules 42, 45 and 47 adjoining the master node form a first level of the communication network with the master node as the parent control module in each case. All other control modules decide which control module they select as the parent control module based on the data received from their respective adjoining control modules. Since the data transfer is clocked, the time delay can be performed on the basis of a clock count. This is to be explained by means of an eleventh control module 51. The eleventh control module 51 is connected by means of corresponding communication lines to the seventh control module 47, a tenth control module 50 and to a twelfth control module 52. The data received from the seventh control module 47 has a time delay of two clock pulses. The data received from the tenth control module 50 has a time delay of four clock pulses. The data received from the twelfth control module 52 has a time delay of also four clock pulses (here, the data passes via the control modules 46, 45, 49 and 52). The parent control module selected should be the one with the smallest time delay. As a result, the eleventh control module 51 selects the seventh control module 47 as the parent control module. This choice is communicated to the parent control module (in this case the seventh control module 47). This creates a connection in the communication network. Accordingly, a corresponding selection is made for all control modules until all (functional) control modules are connected to the communication network. The connections of the communication network created in this way are indicated in FIG. 3 by thickening the lines between the control modules.

Figure 4:
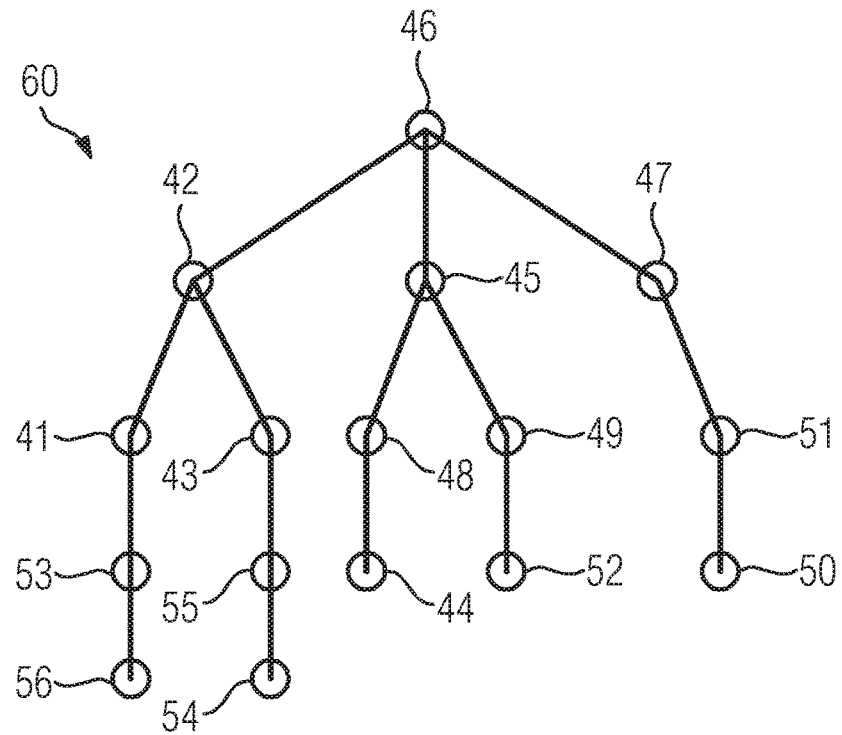
FIG. 4 shows a communication network for the control system in FIG. 3 in a schematic representation.

FIG. 4 shows a hierarchical communication network 60 of the example in FIG. 3. The tree structure of the communication network 60 can be recognized. The master node 46 bundles the data exchange. The remaining nodes of the communication network correspond to the control modules 41-55 in the branched tree structure. In the event of a failure of a communication line or a control module 41-55, a new tree structure or a new communication network can be established in a timely manner.

The invention claimed is:

1. A method for controlling controllable power semiconductor switches of a converter assembly with a plurality of switching modules having controllable power semiconductor switches, the method which comprises:
   providing a control system configured to control the power semiconductor switches of the plurality of switching modules;
   the control system including a central controller and a plurality of control modules each assigned to control one of the plurality of switching modules;
   the central controller configured to exchange digital data with each one of the plurality of control modules;
   the plurality of control modules forming a connection network, wherein each one of the plurality of control modules is connected to exchange data with at least one other one of the plurality of control modules;
   one of the plurality of control modules of the connection network being a master node directly connected to the central controller;
   the plurality of control modules forming a communication network within the connection network so that data exchange between the central controller and each particular one of the plurality of the control modules can be carried out via a communication path assigned to the particular one of the plurality of the control modules within the communication network;
   each one of the plurality of control modules automatically defining one, among all adjoining ones of the plurality of control modules, as a superordinate control module and receiving data from the superordinate control module during operation of the control system;
   each of the plurality of switching modules having a respective one of the plurality of control modules assigned thereto;
   the control system controlling the power semiconductor switches; and
   the plurality of control modules forming a hierarchical communication network with a tree structure within the connection network.

2. The method according to claim 1, wherein each of the plurality control modules is set up to evaluate a transmission time of data that said respective control module receives from different adjoining ones of the plurality control modules within said connection network so that a shortest communication path can be detected for each of the plurality control modules.

3. The method according to claim 1, wherein said communication lines are fiber optic cables.

4. The method according to claim 1, wherein the plurality control modules are configured to digitally process data.

5. The method according to claim 1, wherein each of the plurality control modules is connected to three other ones of the plurality control modules.

6. The method according to claim 1, wherein the plurality control modules are set up for two-way data exchange.

7. A converter assembly, comprising:
   a plurality of switching modules having controllable power semiconductor switches;
   a control system configured for performing the method according to claim 1;
   said control system including a plurality of control modules, wherein each of said plurality of switching modules has a respective one of said plurality of control modules assigned thereto, and said control system is configured to control said power semiconductor switches of said plurality of switching modules.

8. The method according to claim 1, wherein a data transmission is clocked, with a clock delay of less than 10 microseconds.

9. The method according to claim 8, wherein the communication path is determined for each of the control modules by determining a shortest transmission time for the respective control module.

10. The method according to claim 1, wherein, in case of failure of one of the control modules or one of the communication lines, a hierarchical communication network is established again.

* * * * *